(12) United States Patent
Helal (10) Patent No.: US 10,671,624 B2
(45) Date of Patent: Jun. 2, 2020

(54) PARALLEL FILTERING OF LARGE TIME SERIES OF DATA FOR FILTERS HAVING RECURSIVE DEPENDENCIES

(71) Applicant: The MathWorks, Inc., Natick, MA (US)

(72) Inventor: Hatem Helal, Cambridge (GB)

(73) Assignee: The MathWorks, Inc., Natick, MA (US)

( * ) Notice: Subject to any disclaimer, the term of this patent is extended or adjusted under 35 U.S.C. 154(b) by 176 days.

(21) Appl. No.: 16/006,932

(22) Filed: Jun. 13, 2018

(65) Prior Publication Data

US 2019/0384848 A1    Dec. 19, 2019

(51) Int. Cl.
*G06F 16/00* (2019.01)
*G06F 16/2458* (2019.01)
*G06F 17/12* (2006.01)
*G06F 16/2455* (2019.01)

(52) U.S. Cl.
CPC .... *G06F 16/2474* (2019.01); *G06F 16/24566* (2019.01); *G06F 17/12* (2013.01)

(58) Field of Classification Search
CPC . G06F 17/12; G06F 16/2474; G06F 16/24566
See application file for complete search history.

(56) References Cited

U.S. PATENT DOCUMENTS

| | | | |
|---|---|---|---|
| 2011/0035188 A1* | 2/2011 | Martinez-Heras ... | G05B 23/021 702/189 |
| 2016/0055204 A1* | 2/2016 | Mathur ............... | G06F 16/2471 707/713 |
| 2016/0253381 A1* | 9/2016 | Kim .................. | G06F 16/24568 707/718 |
| 2016/0328432 A1* | 11/2016 | Raghunathan ...... | G06F 16/2228 |
| 2016/0357828 A1* | 12/2016 | Tobin ................. | G06F 16/2477 |
| 2016/0378809 A1* | 12/2016 | Chen .................. | G06F 16/2455 707/755 |
| 2019/0294599 A1* | 9/2019 | Ward .................. | G06F 16/2474 |

* cited by examiner

*Primary Examiner* — Cheryl Lewis
(74) *Attorney, Agent, or Firm* — Wolf, Greenfield & Sacks, P.C.

(57) ABSTRACT

Filtering apparatus and methods associated with filtering large time series of data are described. A filtering process containing recursive dependencies can be organized as a series of computational tasks, at least some of which can be performed in parallel. Because of parallel execution of some tasks, an amount of time for filtering large time series of data with a filter exhibiting recursive data dependencies can be reduced significantly.

21 Claims, 7 Drawing Sheets

PARALLEL FILTERING OF LARGE TIME SERIES OF DATA FOR FILTERS HAVING RECURSIVE DEPENDENCIES

SUMMARY

The described technology relates to apparatus and methods for applying parallel filtering techniques to large time series of data in which a filter operation contains recursive dependencies. According to the present embodiments, filtering processes, which would otherwise be executed in a serial manner, can be organized as a series of tasks of which at least some can be performed in parallel. Performing some tasks in parallel can reduce the overall time and computation burden when filtering large time series of data.

Some embodiments relate to a method of filtering a signal for operation of a system that is arranged to receive the signal. The method can comprise acts of receiving, by a first data processing device of a filter, a partition of N data values comprising a time series of data that is representative of a first portion of the signal; solving, by the first data processing device, a first portion of a recursive filter equation to obtain K final filter values for the partition prior to obtaining all N filter values for the partition, where K<N; and providing the final filter values for operation of the system.

Some embodiments relate to a filter adapted to filter a large time series of data. The filter can comprise a first data processing device in communication with memory, wherein the first data processing device is configured to receive a partition of N data values from the time series of data, solve a linear recurrence relation for a first portion of a recursive filter equation to obtain K final filter values for the partition prior to obtaining all N filter values for the partition, where K<N, and to output the N filter values for the partition.

Some embodiments relate to computer-readable medium comprising instructions for filtering large time series of data that, when executed by at least one data processing device, adapt the at least one data processing device to perform acts of receiving, by a first data processing device, a partition of N data values from the large time series of data; and solving, by the first data processing device, a first portion of a recursive filter equation to obtain K final filter values for the partition prior to obtaining all N filter values for the partition, where K<N.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the present invention will become more apparent from the detailed description set forth below when taken in conjunction with the drawings.

DETAILED DESCRIPTION

Mathematical filtering operations can be used to enhance or suppress short-term trends in a time sequence of data (e.g., a stream of data representing a sampled, time-evolving signal). For example, a low-pass filter operation can be implemented in computing code as a filtering function and applied to a data sequence representative of a slowly-varying signal to suppress high-frequency noise that may be corrupting the signal. As another example, a band-pass filter operation can be implemented to enhance irregularities within a certain frequency band for a received signal (e.g., to detect arrhythmia in a cardiac pulse waveform). Another example of filtering may be implementing a high-pass filter (e.g., one that passes signal components at frequencies above a desired cut-off frequency and blocks or suppresses signal components at frequencies below the cut-off frequency). A high-pass filter can be used to reduce or remove systematic measurement errors from a signal of interest. For example, slowly varying temperature changes can add long-term drift to sensed signals produced by a strain-gauge sensor, and such drift in the measured signal can be removed by a high-pass filter. Filtering of data is widely used in signal processing and data analytic fields. Examples for which filtering according to the present embodiments can be applied include, but are not limited to communication signals and systems (wired or wireless), imaging signals and systems (e.g., radio telescope signals and systems, coherence tomography signals and systems, radar and/or lidar imaging signals and systems), medical signals and systems (e.g., EEG, ECG, heart-rate monitors, glucose monitors, etc.), sensor networks deployed for monitoring complex physical or biophysical systems (e.g., machines, distributed power systems, meteorological systems, oceanic systems, seismology systems, human body, etc.), and advanced driver-assistance systems.

In some cases, filtering may be required for large time series of data. Large time series of data can be produced and/or collected over time and comprise a time sequence of data that is representative of some signal (e.g., received communication signal, EEG signal, ECG signal, radio telescope signal, signals from distributed meteorological signals, monitored bioelectrical signal, monitored apparatus signal, etc.) The size of a large time series can be over tens of thousands or even millions of data samples. The present embodiments of filtering are applicable to such time series of data sizes as well as time series of data sizes in the billions of data samples and larger. The present embodiments can also be applied to smaller time series of data. The present embodiments allow time series of data to be filtered in parallel, at least in part, for filtering processes that include recursive dependencies, as explained in further detail below. Prior to the inventive embodiments described herein, filtering processes having recursive dependencies were executed serially. By employing the embodiments described herein, a reduction in time by about 50% or more to obtain a filtered output signal can be achieved.

Figure 1:
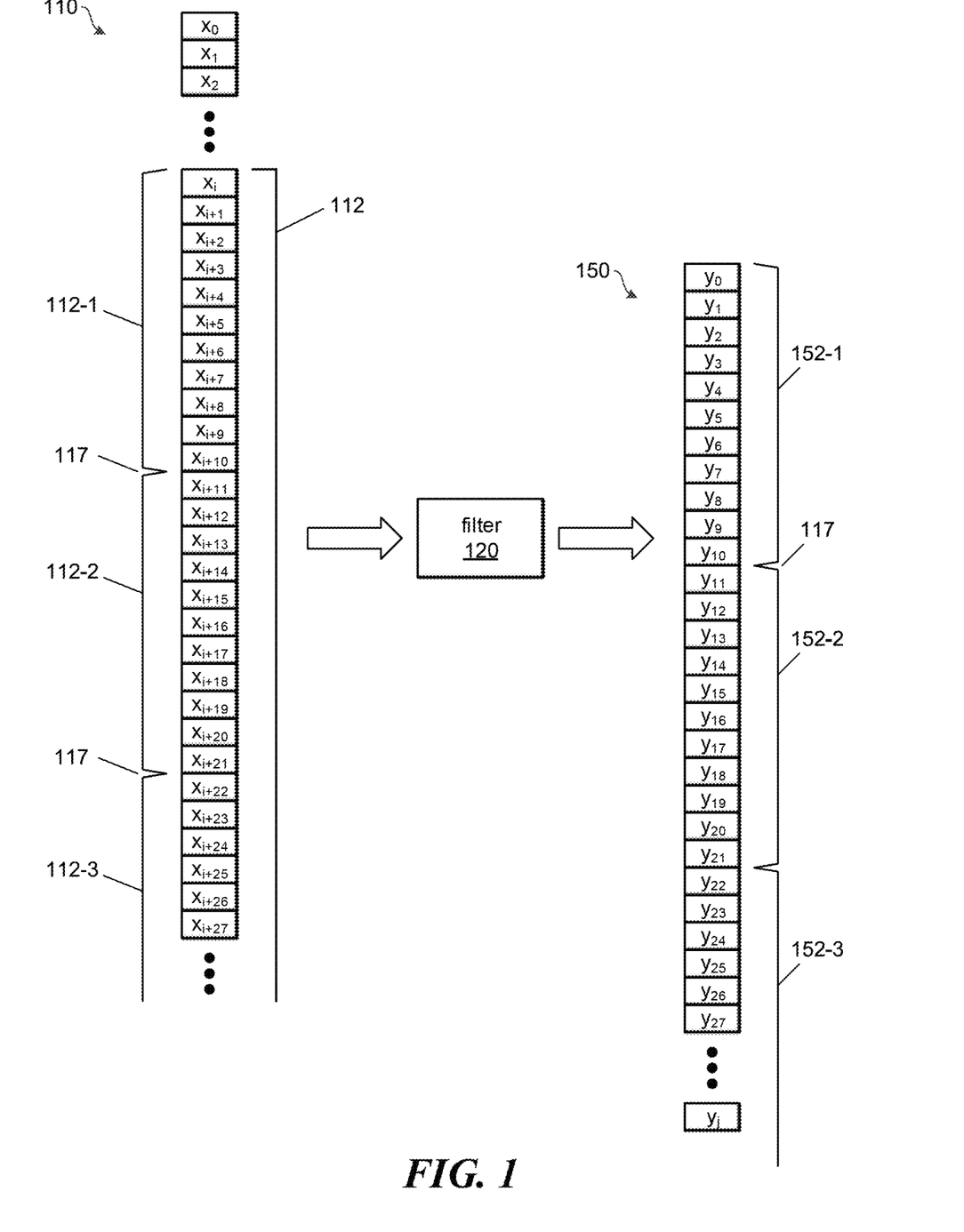
FIG. 1 depicts, in overview, an example of filtering a large time series of data.

FIG. 1 depicts, in overview, example aspects relating to filtering. A large time series of data 110 (sometimes referred to as a "tall array") comprising a long sequence of data values ($x_0, x_1, x_2, \ldots x_i, \ldots$) can be received by one or more processors. Each box (e.g., the box containing $x_1$) can represent a single data value sampled from a received signal. The large time series of data 110 can be representative of a signal and may be referred to herein as a signal. The time series of data 110 can comprise a sequence of binary bits organized into multi-bit words that represent numerical values. At least a portion 112 or all of the large time series of data 110 may be provided to a filter 120. According to some embodiments, the filter 120 can be configured to apply a mathematical filtering operation (which may be a custom filtering operation) to the data of the received portion 112 and produce filter values ($y_0, y_1, y_2, \ldots$) in a filter values time series 150. According to some embodiments, the filtering processes described herein can begin before the entire time series of data 110 is received, e.g., the filtering process can be executed on a live stream of data. Such filtering can be beneficial in active control or tracking of a dynamic system (e.g., advanced driver-assistance system, meteorological system, etc.). Such filtering can reduce an amount of processing time and also reduce an amount of memory required to store an entire time series of data 110 before filtering the data, since data that has been filtered can be overwritten and/or deleted or otherwise made available for storing newly received data. Additionally, the filtering processes can be implemented with multiple data processing devices operating in parallel, which can effectively increase the available memory bandwidth or data-receiving bandwidth of the system.

In embodiments, a filter 120 can comprise hardware and software configured to apply a desired filtering operation on the received data values. The hardware can include at least one data processing device (examples of which follow) that may be in communication with memory which can store machine-readable instructions and data. For example, filter 120 can comprise at least one microprocessor or at least one microcontroller adapted with code to execute a filtering operation on received data values from the large time series of data 110. In some embodiments, filter 120 can comprise a multi-core processor or be implemented on multiple microprocessors that communicate within a network (e.g., one or more processors in a server or server farm or processors in a computing cluster). In some embodiments, filter 120 can comprise at least one field-programmable gate array (FPGA). In some implementations, filter 120 can comprise at least one digital signal processor (DSP) adapted with code to perform a filtering operation. In some cases, filter 120 can comprise at least one application specific integrated circuit (ASIC). In some implementations, filter 120 can comprise at least one graphics processing unit (GPU) adapted with code to perform a filtering operation. In yet other embodiments, filter 120 can comprise a combination of the foregoing described data processing devices.

By way of explanation and without being bound to a particular theory, example filter operations that can be implemented with filter 120 can be represented by the following expression.

$$y_n = \sum_{m=0}^{M} b_m x_{n-m} - \sum_{k=1}^{K} a_k y_{n-k} \qquad (EQ.\ 1)$$

In EQ. 1, $x_n$ represents the received data values (e.g., data from large time series of data 110) to be filtered, $y_n$ represents filtered data values (e.g., values computed for filter values time series 150), $a_k$ represents first filter coefficients (which can be defined by a user), and $b_m$ represents second filter coefficients (which can be defined by a user). The value n is an integer data-value index corresponding to individual data samples or computed filter values. In some implementations, coefficients $a_k$ and $b_m$ may be set or adjusted automatically in a data processing device as part of a feedback or optimization process executed by the data processing device. The values of m and k are integers. The values of M and K are integers that can be defined by a user or filter designer (or automatically adjusted by a data processing device). M and K may be referred to as "look-back" values. EQ. 1 may also be referred to or recognized as "difference equations."

In embodiments, EQ. 1 applies to linear time-invariant filtering processes that can be applied to signals obtained from physical systems, as described above for example, to reduce noise or accentuate a feature of a signal. The $x_n$ can be sampled data values of a signal and represent a time sequence of the signal. In some cases, the $x_n$ can be sampled at regular time intervals by a separate data sampling device that is in communication with filter 120. The computed $y_n$ values can represent a time sequence of filtered output values in filter values time series 150, for example. The filter coefficients $a_k$ can be normalized, according to some implementations, so that $a_0=1$.

In practice, the filter coefficients $a_k$ and $b_m$ and integers M and K can be selected and/or adjusted by a user or filter designer to achieve a desired amount of attenuation for undesirable signal characteristics (e.g., noise) while simultaneously enhancing desirable characteristics (e.g., signal features that indicate a particular event). As an example, a user may set or adjust the values of $a_k$, $b_k$, M, and K to detect rapid or high-frequency changes in acceleration values streamed from an accelerometer attached to a human subject in order to detect a fall of the subject. In some embodiments, the values of $a_k$, $b_k$, M, and K can be adjusted via a user interface that allows a user to manually set and/or change one or more of these values. In some systems in which the filtering is employed as part of a feedback or control loop, one or more of $a_k$, $b_k$, M, and K may be set or adjusted automatically by a processor in the system to improve performance of the system. When $|\{a_0, a_1, \ldots a_m\}|$ is greater than 1, EQ. 1 represents an infinite impulse response (IIR) filter, which may also be referred to as an autoregressive or recursive filter. Filters constructed according to EQ. 1 can be applied to communication signals and systems (wired or wireless), imaging signals and systems (e.g., radio telescope signals and systems, coherence tomography signals and systems, radar and/or lidar imaging signals and systems), medical signals and systems (e.g., EEG, ECG, heart-rate monitors, glucose monitors, etc.), sensor networks deployed for monitoring complex physical or biophysical systems (e.g., machines, distributed power systems, meteorological systems, oceanic systems, seismology systems, human body, etc.), and advanced driver-assistance systems to remove noise and/or accentuate signal features indicative of an event.

As may be appreciated from EQ. 1, recursive data dependencies arise from the second summation, making each filtered output value $y_n$ dependent upon K previous filter values $y_{n-k}$, each of which in turn depends upon its K previous filter values. The second summation expresses a linear recurrence in terms of the filtered output values $y_n$. As may also be appreciated from the first summation in EQ. 1, each filtered output value $y_n$ also depends upon M previous received data values $x_{n-m}$. The first summation can be viewed as a moving average of the received data values $x_n$. The presence of the recursive dependencies complicates the filtering computations for large time series of data, since each $y_n$ depends on all prior filter values in the filter values time series 150 and all prior data values $x_n$.

Because of the recursive dependencies, one approach to implementing a filter operation according to EQ. 1 is to execute a step-by-step, serial computation where each $y_n$ value is computed sequentially after applying initial conditions when starting a filtering process. For example, and referring to FIG. 1, the first filter value $y_0$ may be obtained using initial conditions. Each subsequent filter value $y_1$, $y_2$, $y_3$, ... may be computed using previous values of $y_n$ and $x_n$ according to EQ. 1, and initial conditions when needed. In this manner, the $n^{th}$ filter value (e.g., the value $y_{20}$) can only be computed after all previous $y_n$ values ($y_0, y_1, y_2, \ldots y_{19}$) have been computed. For large time series of data 110, such a serial calculation process can be a computationally burdensome and time intensive for a single data processing device. Additionally, in some cases a time series of data 110 may be so large that it cannot fit within the memory accessed by a single data processing device, creating further difficulties for producing a filtered output time series of data 150. Even if the time series of data $x_n$ were divided and distributed among different machines or stored in different locations to handle such large time series of data, the processing of each block of data would have to await prior processing of all prior blocks of data received in the sequence $x_n$. Accordingly, there would be no benefit in total computation time in dividing the filtering process among several machines.

To overcome limitations associated with conventional serial filtering methods, the inventors have recognized and appreciated that the filtering process of EQ. 1 can be organized into several tasks, at least some of which can be performed in parallel. Due to the parallel processing, the computational burden for a single machine can be relieved and the overall computation time for a filtering operation on large time series of data can be reduced significantly. An example process that implements parallel processing for a linear time-invariant filtering operation according to EQ. 1 will now be described.

The inventors have recognized and appreciated that the solution to EQ. 1 can be decomposed into a combination of two solutions according to the following expression.

$$y = y_{x0} + y_{ic0} \quad (EQ. 2)$$

In EQ. 2, y (bold type) is used as shorthand notation for all the $y_n$ filter values of EQ. 1, $y_{x0}$ represents a zero-input partial solution relevant to EQ. 1, and $y_{ic0}$ represents a zero-conditions partial solution relevant to EQ. 1. Once the zero-input $y_{x0}$ and zero-conditions $y_{ic0}$ partial solutions are found (as described below), they can be added together to obtain the $y_n$ filter values corresponding to the filter solution y. With the recognition of decomposition and superposition of partial solutions in EQ. 2, the input time series of data 110 can be partitioned into sub-arrays 112-1, 112-2, 112-3, ... as indicated in FIG. 1, and some computational steps in obtaining the filtered solution y can be performed in parallel on the sub-arrays when computing the filter values $y_n$.

To aid further explanation, a partition will be represented with a bold type and superscript integer or integer symbol in parentheses. For example, $x^{(1)}$ represents a first partition 112-1 containing data values $(x_i, x_{i+1}, \ldots x_{i+10})$. The first partition 112-1 of data values may be a first time sequence of data that is subject to filtering. According to some implementations, the sizes of the partitions 112-n can be the same, though the invention is not limited to partitions of a same size. The inventors have recognized and appreciated that partitions 112-n having different sizes can be used for the filtering processes of the present embodiments.

Figure 2:
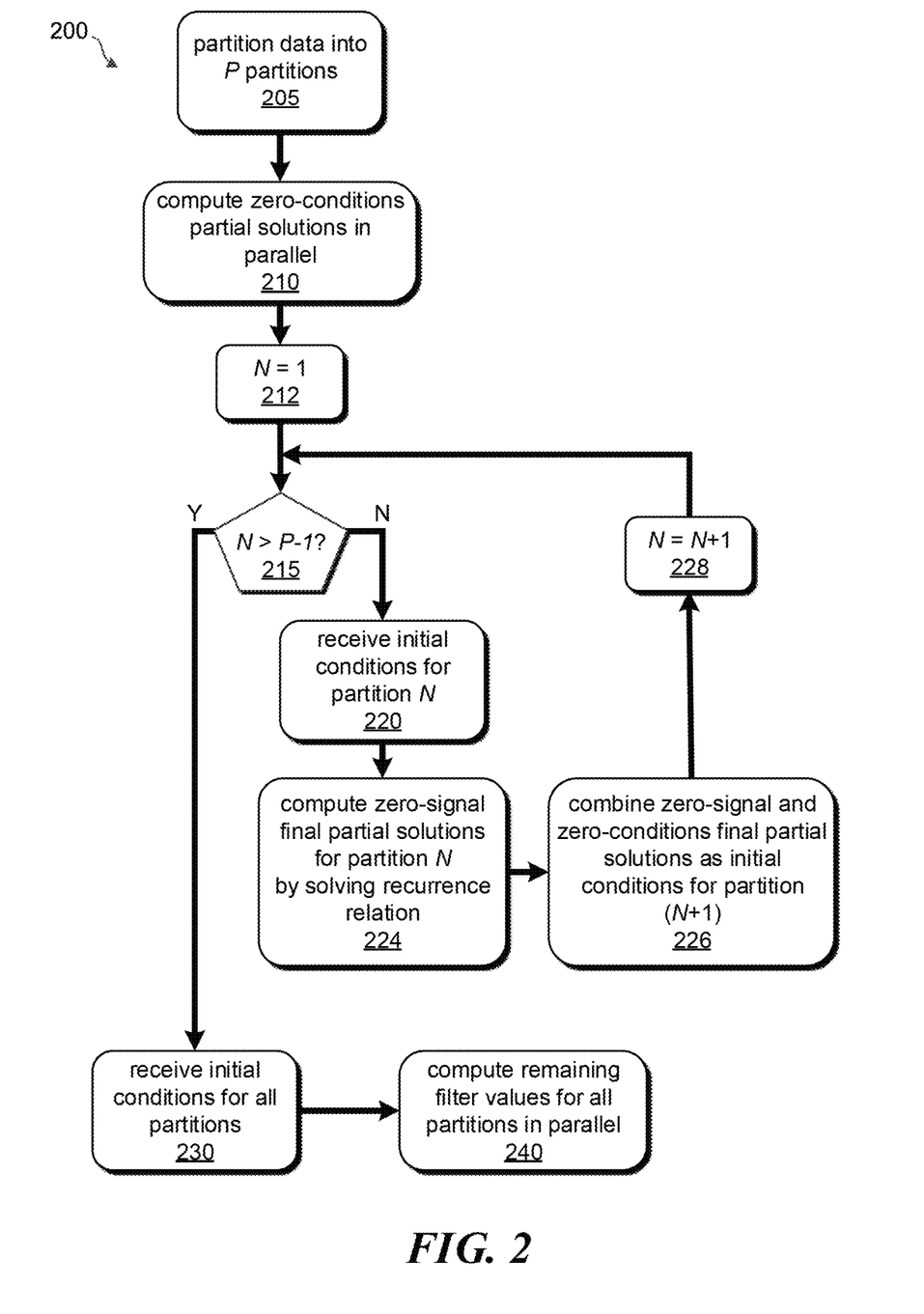
FIG. 2 depicts, in overview, an example process for filtering a large time series of data.

In overview, an example filtering method 200 for large time series of data 110 that includes parallel computational steps is illustrated in FIG. 2. According to some embodiments, a filtering method comprises partitioning a received time series of data (act 205) into P partitions, and computing zero-conditions partial solutions (act 210) for each partition in parallel. According to some embodiments, partitioning of the data can be done by a server or single data processing device that receives time series data and distributes the data to several processing systems in communication with the server or single device. In some implementations, a server can comprise one or more data processing devices. In some cases, a networked data acquisition system may partition the data across a distributed file system. In some implementations, partition sizes can be determined based on machine parameters such as memory size and/or processing speed. An example method for computing the zero-conditions partial solutions $y_{ic0}$ is described in further detail below.

To obtain the filter values y according to EQ. 2, the zero-input $y_{x0}$ values need to be computed. The computation of the zero-input $y_{x0}$ values involve computing initial conditions for each partition of filter values 152-1, 152-2, 152-3, etc, as will be described in further detail below. In overview and according to some embodiments, a partition counter q can be used as part of a filtering algorithm to iterate computation steps for each partition of filter values. For example, a counter q may be set to an initial value (act 212). The value of the internal counter may be compared against a total number of partitions P to determine (act 215) a branching of the method 200. If it is determined (act 215) that there are more partitions to be pre-processed (e.g., q<P−1), the method can receive initial conditions for the current ($q^{th}$) partition (act 220). With reference to EQ. 1, the initial conditions for the current partition can be the prior M data values $(x_{n-m})$ and the prior K filter values $y_{n-k}$.

Once computed, the initial conditions for each partition may be received as separate data values $(x_{n-M}, x_{n-M-1}, \ldots x_n)$ and filter values $(y_{n-K}, y_{n-K-1}, \ldots, y_{n-1})$, or may be received as "delays" which combine the data values and filter values into delay values according to conventional methods of expressing delays. An advantage of using delays, is that a smaller amount of data is stored and communicated between partitions or between different data processing devices that operate on partitions. If the initial conditions are received as delays, the delay values can be converted into data values and filter values for initial conditions when computing partial solutions.

With the received initial conditions, the method can continue with computing zero-signal final partial solutions for the current ($q^{th}$) partition (act 224). As described further below, computing zero-signal final partial solutions for each partition can comprise solving a recurrence relation. Instead of computing all zero-signal partial solutions $y_{x0}^{(n)}$ within the current partition, only final partial solutions are computed near the current partition's boundary with the next ($q^{th}+1$) partition. Referring again to EQ. 1, only the $K^{th}$ final zero-signal partial solutions of a prior partition are needed for the next partition and may be computed using an analytic evaluation. According to some embodiments, the computing of final zero-signal partial solutions represents a jumping ahead of computation within each partition to obtain relevant filter values near an end of each partition.

In some embodiments, the $K^{th}$ final zero-signal partial solutions can be used for determining the final filter values of the current ($q^{th}$) partition, which are used as initial conditions of filter values for the next ($q^{th}+1$) partition. For example, the $K^{th}$ final zero-signal partial solutions for the current partition can be combined (act 226) according to EQ. 2 with the $K^{th}$ final zero-conditions partial solutions that were calculated in act 210 to obtain the $K^{th}$ final filter values for the current partition. This combination of the zero-signal and zero-conditions partial solutions can be viewed as a corrective step in which the zero-signal partial solutions correct or fix up the previously calculated zero-conditions partial solutions to obtain the final filter values for the current partition. As an example and referring to FIG. 1 and the first partition 152-1 of filter values, the $K^{th}$ final filter values (assuming K=3) would be ($y_8$, $y_9$, $y_{10}$). The value $y_8$ can be obtained, according to the present embodiments, by combining the final zero-conditions partial solution ($y_{ic0,8}$) calculated in act 210 with the final zero-signal partial solution ($y_{x0,8}$) calculated in act 224. The final filter values ($y_9$, $y_{10}$) can be obtained in a similar way. In embodiments, the $K^{th}$ final filter values computed for the current partition are the initial-condition filter values for the next partition. A method 200 of computing filter values can continue by incrementing a counter (act 228) and returning in loop 202 to determining (act 215) whether all partitions have been pre-processed to obtain the $K^{th}$ final filter values that are needed as initial conditions for subsequent partitions.

According to some implementations, computation loop 202 represents a serial computing portion of the filter process, since initial conditions of filter values are determined for all partitions in a serial process. However, because of the decomposition of EQ. 1 and use of a recurrence solution technique described below, not all filter values need to be calculated within each partition to obtain initial conditions for the next partition. The ability to calculate only filter values near the ends of each partition allows an acceleration and parallelization of the filtering computation.

Once the filter value initial conditions have been determined for the partitions (final filter values for prior partitions), the initial conditions can be received (act 230) by each partition and all remaining filter values can be computed (act 240) for the partitions. The computing of remaining filter values can be performed in parallel using any suitable method. For example, remaining filter values $y_n$ can be computed directly from EQ. 1 or by using a recurrence solution technique to compute zero-signal partial solutions that can be combined with zero-conditions partial solutions to obtain filter values $y_n$.

Figure 3:
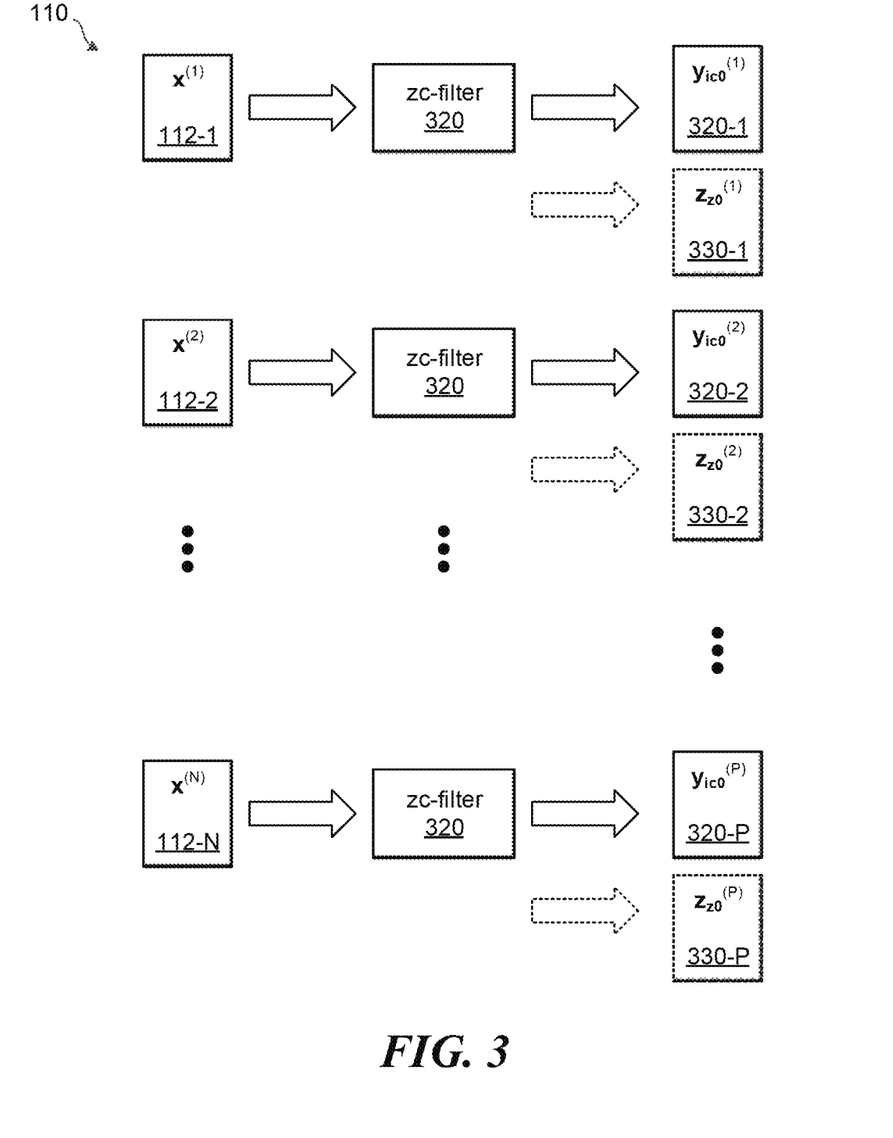
FIG. 3 illustrates an example parallel process that is a portion of a filtering process for filtering a large time series of data.

FIG. 3 illustrates an example block diagram to aid in explaining how zero-conditions partial solutions can be computed. According to some embodiments and referring again to EQ. 1, a zero-conditions partial solution can be obtained by assuming that the initial conditions for filter values are all zero. For example, a zero-conditions filter 320 can comprise a form of EQ. 1

$$y_{ic0,n} = \left[ \sum_{m=0}^{M} b_m x_{n-m} - \sum_{k=1}^{K} a_k y_{n-k} \right]_{i.c.=0} \quad (EQ.\ 3)$$

where the initial condition values of $x_{n-m}$ and $y_{n-k}$ (values occurring before the current partition) are set to 0. With the initial condition values set to 0, EQ. 3 can be readily computed for each partition in parallel in act 210 of method 200, for example, to obtain zero-conditions partial solutions. The zero-conditions partial solutions $y_{ic0}^{(q)}$ (320-1, 320-2, ... 320-P) for each partition q may be stored or transmitted for combination with zero-signal partial solutions. In some embodiments, the zero-conditions partial solutions $y_{ic0}^{(q)}$ can be combined with data values 110 to form zero-conditions delay values $z_{ic0}^{(q)}$ (330-1, 330-2, 330-P) for each partition q, to further reduce an amount of data transmitted between data processing devices.

Figure 4:
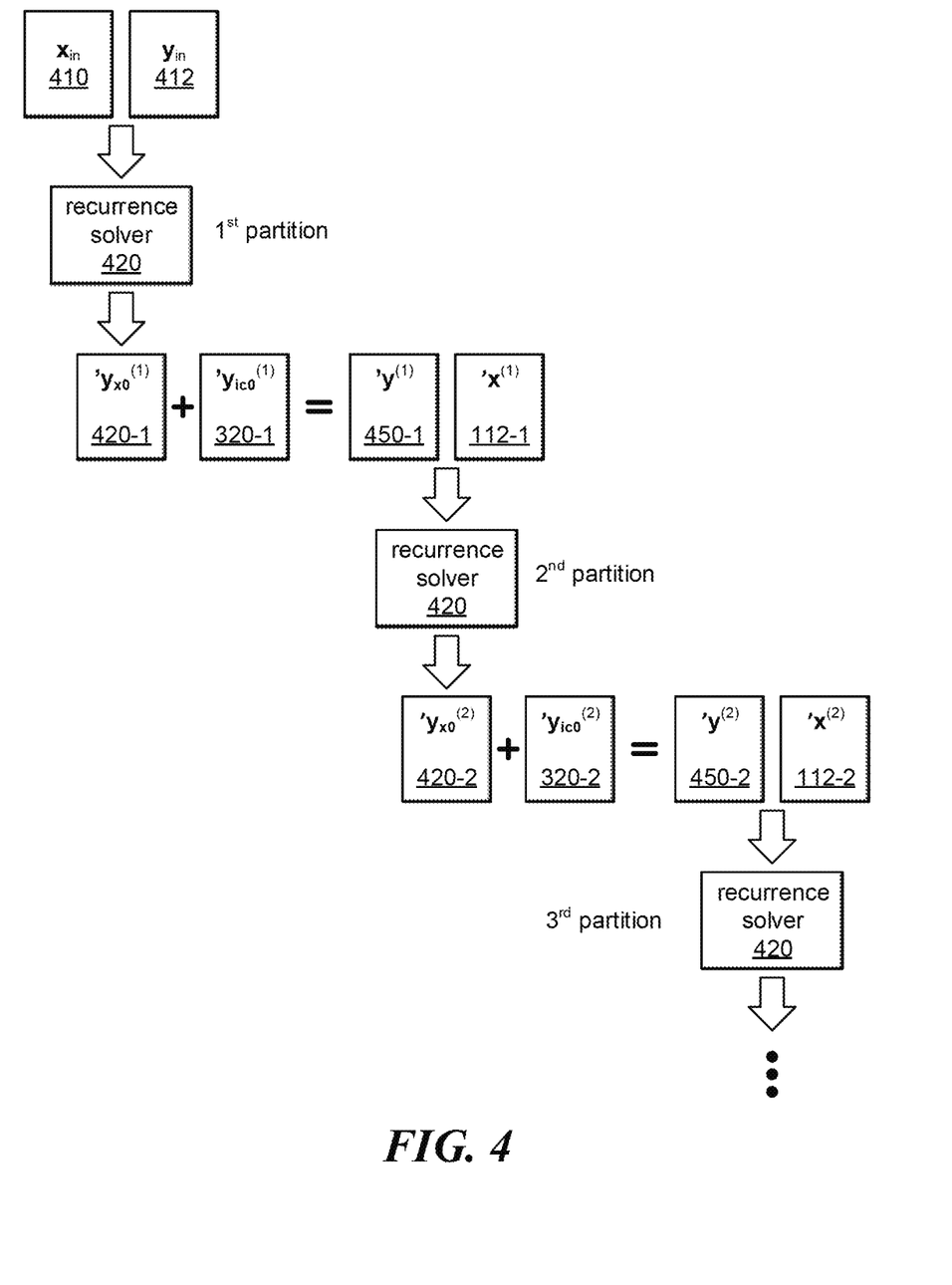
FIG. 4 illustrates an example process for calculating final filter values for partitions of a large time series of data.

Computing zero-signal partial solutions $y_{x0}$ is more complicated than computing zero-conditions partial solutions. An example process for computing zero-signal partial solutions $y_{x0}$ is depicted in FIG. 4. A process for computing zero-signal partial solutions can comprise receiving initial conditions for a first partition and computing, using a recurrence solver 420 for example, $K^{th}$ final zero-signal partial solutions 420-1 for the first partition. In some embodiments, initial conditions for the first partition may be received by the recurrence solver 420 as M prior data values 410 and K prior filter values 412. In other embodiments, initial conditions may be received as delay values. The initial conditions for the first partition may be received from a user (e.g., input via a user interface manually), may be received from memory, or may be default values (e.g., 0 or any other numerical value) stored in memory accessed by filter 120.

According to some embodiments, the zero-signal partial solutions $y_{x0}$ can be computed from EQ. 1 by setting the data values $x_n$ (also referred to as signal values) to zero. Setting the data values to zero removes the first summation from EQ. 1 leaving a recurrence relation.

$$y_{x0,n} = -\sum_{k=1}^{K} a_k y_{n-k} \quad (EQ.\ 4)$$

A recurrence relation of the form shown in EQ. 4 can be solved systematically using conventional methods. One approach is to guess a solution of the form $r^n$, which results in a characteristic polynomial having K roots. Substituting $r^n$ for $y_n$ in EQ. 4 gives $$r^n + a_1 r^{n-1} a_2 r^{n-2} + \ldots + a_K r^{n-K} = 0 \quad (EQ.\ 5)$$

where the zero-signal notation has been dropped for convenience and is now implied. Dividing EQ. 5 by $r^{n-K}$ produces a characteristic equation:

$$r^K + a_1 r^{K-1} + a_2 r^{K-2} + \ldots + a_K = 0 \quad (EQ.\ 6)$$

According to EQ. 6, $r^n$ is a solution to EQ. 4 if and only if the constant r is a root of the characteristic equation (EQ. 6). Numerical techniques can be used to find the K roots $(r_1, r_2, \ldots, r_K)$ of the polynomial in EQ. 6. Assuming the roots are distinct, it can be shown that a closed-form solution to EQ. 4 can be written as $$y_{xO,n} = \sum_{k=1}^{K} c_k r_k^n \qquad \text{(EQ. 7)}$$

where the $c_k$ are coefficients can be determined by solving a linear system of equations numerically. For example, initial conditions at each partition can be used to determine the first K terms of the linear recurrence. From the first K terms and the solution of EQ. 7, a linear system of equations can be constructed and solved numerically. The linear system of equations can appear as follows:

$$\begin{bmatrix} 1 & 1 & \cdots & 1 \\ r_1 & r_2 & \cdots & r_K \\ r_1^2 & r_2^2 & \cdots & r_K^2 \\ \vdots & \vdots & \ddots & \vdots \\ r_1^K & r_2^K & \cdots & r_K^K \end{bmatrix} \begin{bmatrix} 1 \\ c_1 \\ c_2 \\ \vdots \\ c_K \end{bmatrix} = \begin{bmatrix} y_0 \\ y_1 \\ y_2 \\ \vdots \\ y_K \end{bmatrix} \qquad \text{(EQ. 8)}$$

Closed-form solutions to EQ. 4 can also be found when the roots of EQ. 6 are not distinct. A method of finding solutions to EQ. 4 when the roots of EQ. 6 are not distinct can be found at https://math.berkeley.edu/~arash/55/8_2.pdf, which information is incorporated herein by reference. Accordingly, the filtering processes described herein can be implemented for a broad range of filter coefficients, and is not limited to the case where the roots are distinct.

Once the $c_k$ are found, EQ. 7 can be evaluated to obtain the final K zero-signal partial solutions in each partition (corresponding to act 224 of FIG. 2, for example). These final K zero-signal partial solutions can be combined with final zero-conditions partial solutions (computed as described above in connection with EQ. 3) for each partition to obtain the final K filter values for each partition (corresponding to act 226 of FIG. 2, for example). As described above, the final K filter values for each partition can be used as initial conditions for the next partition.

A desirable feature of using a recurrence solver is that a number of operations and storage requirements remain essentially constant and is independent of the size or length of the time series being filtered, which can yield an overall linear-time data parallel algorithm for evaluating filter equations of the form shown in EQ. 1. Because parallel processing is now possible for filter functions of the form shown in EQ. 1, large time series of data can be partitioned and divided among a plurality of data processing devices to reduce a data and/or computation burden on a single data processing device and to reduce an overall computation time when filtering the received data.

Figure 5:
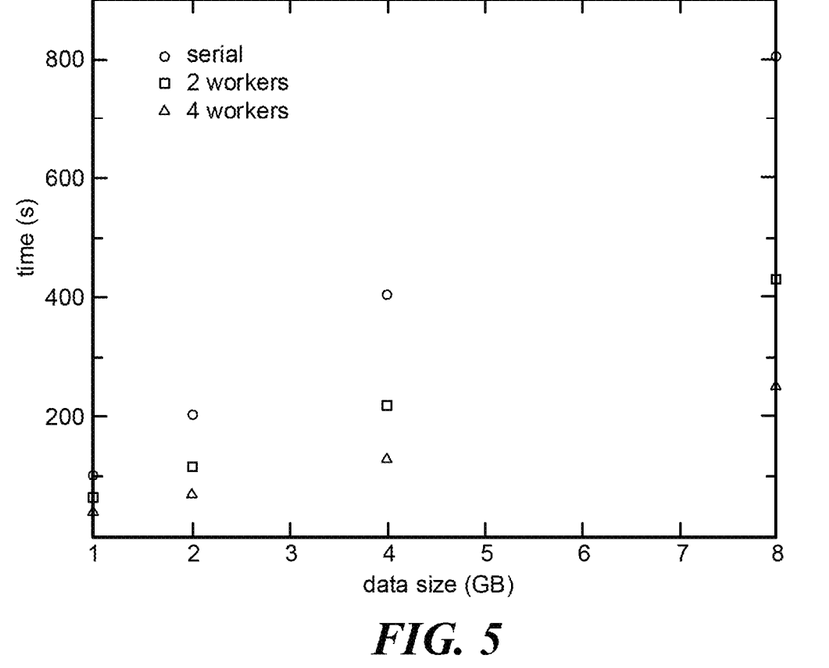
FIG. 5 illustrates example results of parallelized filtering according to the present embodiments and a conventional serial filtering process.

FIG. 5 depicts comparative results of a filtering process performed by a different number of data processing devices (also referred to as workers) on different sizes of time series data (ranging from 1 gigabyte to 8 gigabytes in this example). Both infinite impulse response (IIR) and finite impulse response (FIR) filters were tested and the results were similar for both types of filters. In both cases, the input signal x was a sequence of pseudo random-numbers sampled from a normal probability distribution. The FIR filter was a moving or trailing average filter having a window length of 10. For these example tests, M=9, K=1 in EQ. 1 and $a_1=1$ and $b_{0, 1, \ldots, 9}=0.1$. The IIR filter comprised a decaying exponential function that had the effect of amplifying high-frequency signal components while suppressing low-frequency components. For these example tests, M=0, K=10 in EQ. 1 $a_k=\exp(-0.1k)$ and $b_0=1$. For a first case (shown as circles), a conventional serial process executed on a single worker was used to filter the time series of data. In a second case (shown as squares), a parallelized filtering process according to the present embodiments was implemented with two workers. The reduction in time to a filtered time series for the second case compared to the conventional serial process was approximately 46%. In a third case, a parallelized filtering process according to the present embodiments was implemented with four workers. The reduction in time to a filtered time series for the third case compared to the conventional serial process was approximately 68%.

Figure 6:
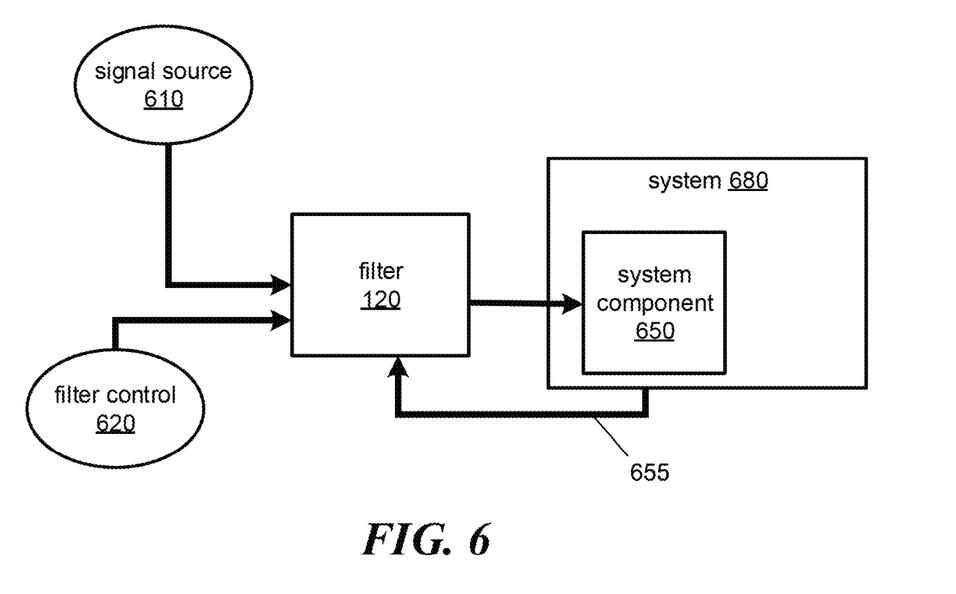
FIG. 6 depicts an example system in which a filter according to the present embodiments can be used.

FIG. 6 illustrates a system in which a parallelized filter 120 can be implemented. A parallelized filter may be implemented as hardware and software as described above (e.g., one or more processors, microcontrollers, FPGAs, DSPs, ASICs, GPUs, or a combination of such devices). A signal source 610 (e.g., medical sensor(s), communication channel, video stream, radar signal, radio telescope signal, etc.) may provide a time series data stream to the filter 120 or to memory that is accessed by the filter 120. In embodiments, a user may operate filter controls 620 (e.g., via a user interface, physical knobs, or changing circuit components) to design a filter and/or set filter parameters (e.g., filter coefficients $b_m$, $a_k$ and look-back values M and K). Time series data received by the parallelized filter 120 can be processed according to the embodiments described herein and output for use by a system component 650 of a larger system 680. The system 680 may use the filtered data for operation of the system. In some cases, the system 680 that uses the filtered data can be remote from the filter that receives and processes the time series data stream, and output from the filter 120 can be transmitted via a wired or wireless link to system 680. In some cases, feedback information may be provided via a signal path 655 to filter 120 as part of an automated process for adjusting filter parameters to improve operation of the system 680.

As one example, signal source 610 can be a wired or wireless communication transmitter. System component 650 can be a signal decoder that receives a filtered signal from filter 120, processed the filtered signal, and outputs a decoded signal. System 680 can be a receiver or transceiver (e.g., a component of a radio, wireless phone, personal computer) in this example that further processes the decoded signal and renders it in a form recognizable to a user of system 680. As a second example, signal source 610 can be a cardiac sensor. System component 650 can be a digital signal processor that receives a filtered signal from filter 120 and is configured to process the filtered signal to detect an arrhythmia in the received filtered signal. System 680 can be a heart monitor instrument in this example, and include a display on which detection of an arrhythmia can be displayed. As another example, signal source 610 can be a video camera streaming live videos of people. System component 650 can be one or more processors that receive one or more filtered signals from one or a plurality of filters 120 operating in parallel. The system components 650 can be configured to execute facial-recognition operations based, at least in part, on the filtered signals as part of a security system. As yet another example, signal source 610 can be backscattered radiation from a LIDAR source mounted on an aircraft. System component 650 can be a digital signal processor that receives a filtered signal from filter 120 and is configured to process the received filtered data to detect wind shear. System 680 can be an aircraft guidance and automated piloting system. As may be appreciated, filtering hardware and software of the present embodiments can be incorporated in a variety of signal detection and sense-and-control systems.

Figure 7:
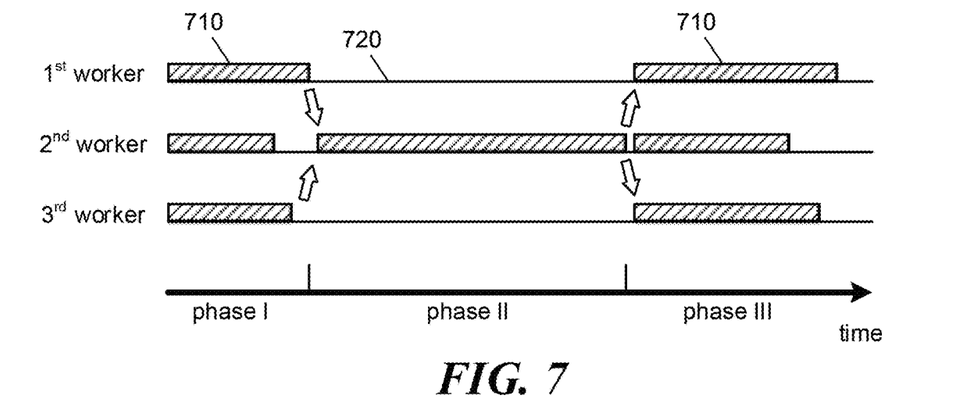
FIG. 7 depicts a first example of a processing scheme for filtering a large time series of data.
Figure 8:
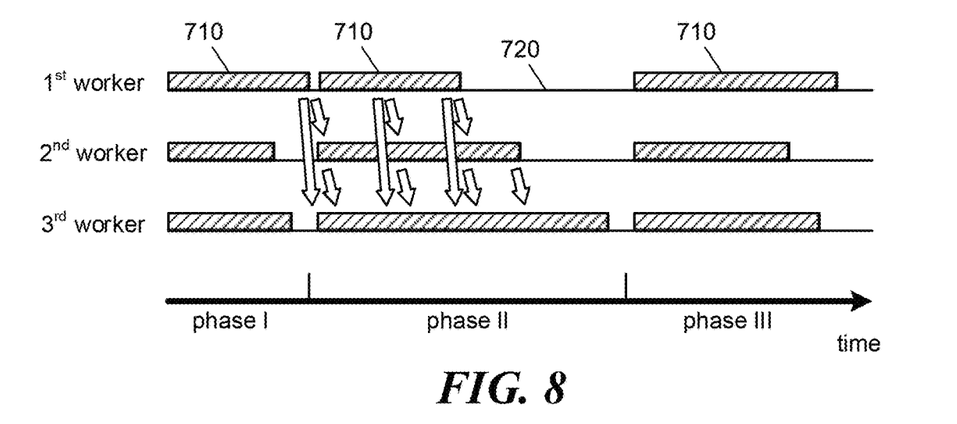
FIG. 8 depicts a second example of a processing scheme for filtering a large time series of data.
Figure 9:
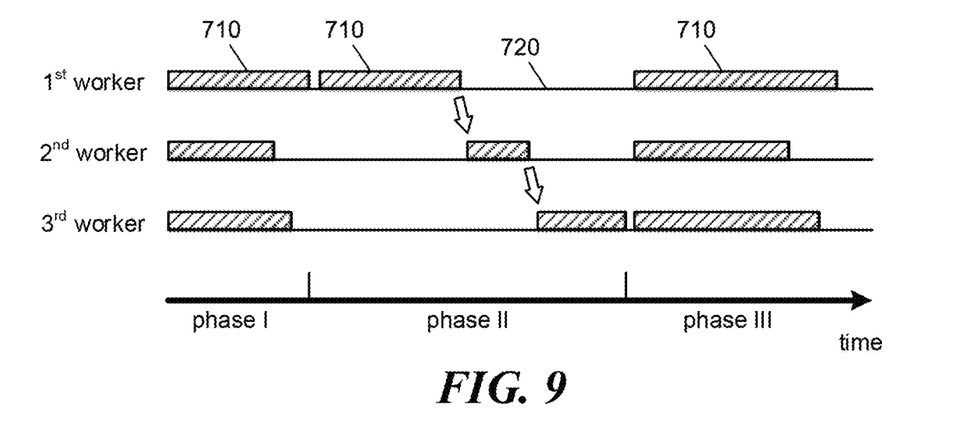
FIG. 9 depicts a third example of a processing scheme for filtering a large time series of data.

A filtering method 200, an example of which is depicted in FIG. 2, can be managed among plural data processing devices (also referred to as workers) in several different ways, as depicted in the examples of FIG. 7 through FIG. 9. The time plots illustrate dedicated computing intervals 710 when a worker is performing a computation for a filtering method and non-dedicated intervals 720 when a worker is available for other tasks. Although the drawings illustrate only three workers, there can be more or fewer in various embodiments of the invention. Each worker can handle a number of partitions 112-$p$ which may be the same or different among the workers. The sizes of the partitions can be the same or different.

According to some embodiments, during a first phase (phase I) of a filtering method, all workers can be performing a computation for a filtering method, such as computing zero-conditions partial solutions $y_{ic0}^{(p)}$ for their respective partitions as described in connection with act 210 above. In this phase, the computations can be performed in parallel. The first phase may be essentially the same for each of the cases shown in FIG. 7 through FIG. 9.

According to an example depicted in FIG. 7, a second phase (phase II) of a filtering method may be handled by a single worker (which may be a master or scheduler to other workers). The single worker ($2^{nd}$ worker in the illustrated example) may gather summary data from other workers and then broadcasts its computation results back to the other workers. The summary data can include sizes of each partition, final data values, final zero-conditions partial solutions, and/or final partial delay values. The second phase may correspond to computations associated with obtaining final zero-signal partial solutions (loop 202 of FIG. 2). If handled by a single worker, data from other workers (e.g., final data values and final zero-conditions partial solutions or final partial delays) would be transmitted to the signal worker from other workers so that the single worker could perform computations to determine the final filter values for each partition. The single worker would in turn transmit data (e.g., final filter values or final delays) back to other workers after they are computed. The transmission of final filter values or final delays can occur as they are computed (e.g., during phase II) or after computing all final filter values or final delays (e.g., at an end of phase II). In a third phase (phase III), the remaining filter values for all partitions can be computed in parallel, e.g., corresponding to act 240 described above. The paradigm illustrated in FIG. 7 frees up the other workers for other tasks during phase II of the process. This paradigm does not require synchronization among workers.

Another example approach for the second phase is depicted in FIG. 8. In this example, a first worker handling a first sequence of partitions can broadcast its results of final filter values and final data values or final delays to all other workers handling subsequent sequences of partitions of received data values 110. Similarly, any worker may broadcast its results of final filter values and final data values or final delays to all other workers handling subsequent sequences of partitions of received data values 110. In this manner, each worker can calculate final filter values in parallel up to a current partition handled by the worker. Although the parallel computation approach depicted in FIG. 8 for phase II performs redundant computations among workers, it can be suitable for some computing clusters. The paradigm of FIG. 8 may require synchronization among the workers, but can relieve computational burden of a single worker compared to the paradigm illustrated in FIG. 7. For example, no single worker needs calculate all final zero-signal partial solutions for all partitions.

Yet another example approach for the second phase is depicted in FIG. 9. In this example, data transfer and computations are pipelined among the workers. A first worker handling a first sequence of partitions can perform its computations of final filter values for its partitions. After computing final filter values for the last partition handled by the first worker, the final filter values and final data values or final delays for that partition can be passed to the second worker. The second worker can then perform its computations of final filter values for its partitions, and so on for the remaining workers. The pipelining can reduce an amount of data transmission between workers, but can require synchronicity of the workers.

Although phase III is depicted as beginning after the conclusion of phase II for each worker in FIG. 7-FIG. 9, such timing is not required. In some cases, computations for phase III can begin for some workers while other workers are still performing phase II computations. For example and referring to FIG. 9, the first worker may begin its phase III computations for its partitions immediately after completing its phase II computations, since the first worker will have all values needed for computing the filter values $y^{(q)}$ of its partitions.

In some cases, the present embodiments of parallelizing filter operations can be applied to filter operations that have a form different than that shown in EQ. 1. The present embodiments may be applied to filter operations that are separable, such that a recursive relation expressed in terms of filter values $y_n$ and not data values $x_n$ can be separated out of the filter operation and solved using any suitable solution technique for solving recurrence relations.

Filtering methods as described in the above examples can be implemented in various computing environments. Examples of computing environments to which the present embodiments can be applied include Octave; Python; Julia; Comsol Script; MATRIXx from National Instruments; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; and aspects of a Unified Modeling Language (UML) or SysML environment; etc.). In some cases, the present embodiments of filtering large time series of data can be applied to a hybrid environment that includes one or more of the above-referenced text-based environments and one or more of the above-referenced graphically-based environments.

Examples of computing languages used in programming environments to which the present embodiments can be applied include, but are not limited to, Ada, Basic, C, C++, C#, MATLAB, FORTRAN, Pascal, assembly code, and Hardware Description Language (HDL) code, such as VHDL, Verilog, SystemC, Java, JavaScript, Python, Julia, R, R++, Octave, Ruby, and iOS/Swift.

Figure 10:
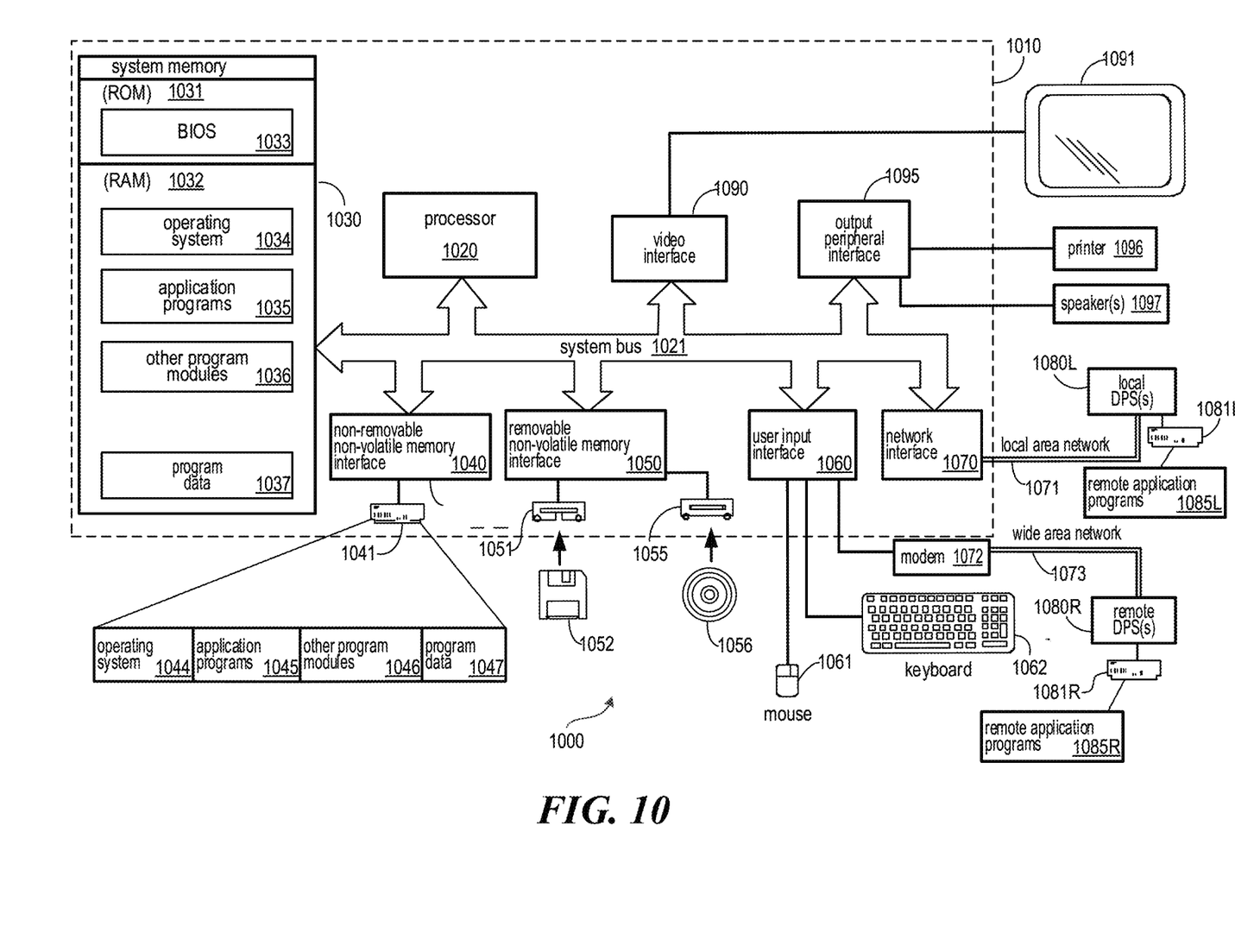
FIG. 10 illustrates an example computing apparatus that can be specially adapted with computer programming instructions to filter large time series according to parallel processing techniques described in embodiments below.

FIG. 10 depicts, in further detail, components of a data-processing system 110 that can be adapted to implement filtering processes as described above. Some or all of the components shown may be present in a data-processing device of the present embodiments, for example. In a distributed computing environment, some components may be located on a server and some components may be located on a client device. In some embodiments, a device for implementing filtering of large time series of data can include a computing device 1010 which can be embodied as a desktop computer, a workstation, or a laptop computer. Suitable workstations include Dell Precision series of workstations from Dell, Inc. of Round Rock, Tex., the HP Z400, Z600 and Z800 series of workstations from Hewlett Packard Co. of Palo Alto, Calif., among others. Other computing devices that may be used include palm computers and other portable computing devices, e.g., smart phones.

Components of computing device 1010 can include, but are not limited to, a processor 1020, a memory 1030, and a bus 1021 that couples various components including the memory to the processor 1020. Example processors 1020 include, but are not limited to, single or multicore processors, such as the Core™ Pentium®, or Celeron® families of processors from Intel Corp. of Santa Clara, Calif., or the Phenom, AMD Athlon or AMD Opteron families of processors from Advanced Micro Devices, Inc. of Sunnyvale, Calif., among others.

The bus 1021 can be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 1010 can include one or more types of machine-readable media. Machine-readable media can be any available media that can be accessed by computer 1010 and includes both volatile and nonvolatile, manufactured storage media, removable and non-removable manufactured storage media. By way of example, and not limitation, machine-readable media may comprise information such as computer-readable instructions, data structures, program modules or other data. Machine-readable media includes, but is not limited to, RAM, ROM, EEPROM, flash memory or other memory-device technology, CD-ROM, digital versatile disks (DVD) or other optical disk storage, magnetic cassettes, magnetic tape, magnetic disk storage or other magnetic storage devices, or any other manufactured data-storage device which can be used to store the desired information and which can be accessed by computer 1010.

The memory 1030 can include computer storage media in the form of volatile and/or nonvolatile memory such as read only memory (ROM) 1031 and random access memory (RAM) 1032. A basic input/output system 1033 (BIOS), containing the basic routines that help to transfer information between elements within computer 1010, such as during start-up, may be stored in ROM 1031. RAM 1032 may contain data and/or program modules that are immediately accessible to and/or presently being operated on by processor 1020. By way of example, and not limitation, FIG. 10 illustrates an operating system 1034, application programs 1035, other program modules 1036, and program data 1037.

The computer 1010 can also include other removable/non-removable, volatile/nonvolatile machine-readable media. By way of example only, FIG. 10 illustrates a hard disk drive 1041 that reads from or writes to non-removable, nonvolatile magnetic media, a magnetic disk drive 1051 that reads from or writes to a removable, nonvolatile magnetic disk 1052, and an optical disk drive 1055 that reads from or writes to a removable, nonvolatile optical disk 1056 such as a CD ROM or other optical media. Other removable/non-removable, volatile/nonvolatile machine-readable media that can be used in the exemplary operating environment include, but are not limited to, magnetic tape cassettes, flash memory cards, digital versatile disks, digital video tape, solid state RAM, solid state ROM, and the like. The hard disk drive 1041 may be connected to the system bus 1021 through a non-removable memory interface such as interface 1040, and magnetic disk drive 1051 and optical disk drive 1055 may be connected to the system bus 1021 by a removable memory interface, such as interface 1050.

The drives and their associated machine-readable media discussed above and illustrated in FIG. 10, provide storage of machine-readable instructions, data structures, program modules and other data for the computer 1010. In FIG. 10, for example, hard disk drive 1041 is illustrated as storing operating system 1044, application programs 1045, other program modules 1046, and program data 1047. These components may either be the same as, or different from, operating system 1034, application programs 1035, other program modules 1036, and program data 1037. Operating system 1044, application programs 1045, other program modules 1046, and program data 1047 are given different numbers here to illustrate that, at a minimum, they are different copies.

A user can enter commands and information into the computer 1010 through input devices such as a keyboard 1062 and pointing device 1061, commonly referred to as a mouse, trackball or touch pad. Other input devices (not shown) can include a microphone, joystick, game pad, satellite dish, scanner, or the like. These and other input devices can be connected to the processor 1020 through a user input interface 1060 that is coupled to the system bus, but can be connected by other interface and bus structures, such as a parallel port, game port or a universal serial bus (USB). A monitor 1091 or other type of display device can also be connected to the system bus 1021 via an interface, such as a video interface 1090. In addition to the monitor, a computing device 1010 can also include other peripheral output devices such as speakers 1097 and printer 1096, which can be connected through an output peripheral interface 1095.

The computer 1010 can operate in a networked environment using logical connections to one or more remote devices, such as a remote computer 1080. The remote computer 1080 may be a personal computer, a server, a router, a network PC, a peer device or other common network node, and may include many or all of the elements described above relative to the computer 1010, although only a memory storage device 1081 has been illustrated in FIG. 10. The logical connections depicted in FIG. 10 include a local area network (LAN) 1071 and a wide area network (WAN) 1073, but may also include other networks. Such networking environments may be commonplace in offices, enterprise-wide computer networks, intranets and the Internet. Network connections can be wired, optical fiber based, or wireless.

When used in a LAN networking environment, the computer 1010 can be connected to the LAN 1071 through a network interface or adapter 1070. When used in a WAN networking environment, the computer 1010 may include a modem 1072 or other means for establishing communications over the WAN 1073, such as the Internet. The modem 1072, which may be internal or external, may be connected to the system bus 1021 via the user input interface 1060, or other appropriate mechanism. In a networked environment, program modules depicted relative to the computer 1010, or portions thereof, may be stored in a remote memory storage device. By way of example, and not limitation, FIG. 10 illustrates remote application programs 1085 as residing on memory device 1081. It will be appreciated that the network connections shown are exemplary and other means of establishing a communications link between the computers may be used.

Example methods of the described filtering technology include combinations of methods (1) through (7) as described below. Example filters that can be implemented according to the described technology are indicated by combinations of configurations (8) through (14), as indicated below. Examples of computer-readable medium that can be implemented according to the described technology are indicated by configurations (15) through (21).

(1) A method of filtering a signal for operation of a system that is arranged to receive the signal, the method comprising receiving, by a first data processing device of a filter, a partition of N data values comprising a time series of data that is representative of a first portion of the signal; solving, by the first data processing device, a first portion of a recursive filter equation to obtain K final filter values for the partition prior to obtaining all N filter values for the partition, where K<N; and providing the final filter values for operation of the system.

(2) The method of (1), wherein the solving comprises solving a linear recurrence relation.

(3) The method of (1) or (2), wherein the solving comprises solving K first final partial solutions and combining the K first final partial solutions with K second final partial solutions to obtain the K final filter values.

(4) The method of (3), further comprising computing, by the first data processing device, the K second final partial solutions in parallel with additional second final partial solutions computed at a second data processing device for a second portion of the signal.

(5) The method of (3) or (4), further comprising providing, by the first data processing device, the K final filter values to a second data processing device, wherein the K final filter values are used as initial conditions for a second partition of data values comprising a time series of data that is representative of a second portion of the signal.

(6) The method of any one of (1) through (5), wherein the recursive filter equation is of the form $$y_n = \sum_{m=0}^{M} b_m x_{n-m} - \sum_{k=1}^{K} a_k y_{n-k}$$

where the $y_n$ represents the filter values, the $x_n$ represents received data values, $a_k$ represents first coefficients, $b_m$ represents second coefficients, and M and K are integers.

(7) The method of (6), wherein the first portion of the recursive filter equation comprises a recursive summation of filter values.

(8) A filter adapted to filter a large time series of data, the filter comprising a first data processing device in communication with memory, wherein the first data processing device is configured to receive a partition of N data values from the time series of data, solve a linear recurrence relation for a first portion of a recursive filter equation to obtain K final filter values for the partition prior to obtaining all N filter values for the partition, where K<N, and to output the N filter values for the partition.

(9) The filter of (8), wherein the first data processing device comprises a field-programmable gate array or digital signal processor.

(10) The filter of (8) or (9), wherein the first data processing device is adapted to compute K first final partial solutions and combine the K first final partial solutions with K second final partial solutions to obtain the K final filter values.

(11) The filter of (10), wherein the first data processing device is adapted to compute the K second final partial solutions in parallel with additional second final partial solutions computed at a second data processing device.

(12) The filter of (10) or (11), wherein the first data processing device is adapted to compute the K final filter values in parallel with additional final filter values computed at a second data processing device.

(13) The filter of any one of (8) through (12), wherein the recursive filter equation is of the form $$y_n = \sum_{m=0}^{M} b_m x_{n-m} - \sum_{k=1}^{K} a_k y_{n-k}$$

where the $y_n$ represents the filter values, the $x_n$ represents received data values, $a_k$ represents first coefficients, $b_m$ represents second coefficients, and M and K are integers.

(14) The filter of (13), wherein the first portion of the recursive filter equation comprises a recursive summation of filter values.

(15) Computer-readable medium comprising instructions for filtering large time series of data that, when executed by at least one data processing device, adapt the at least one data processing device to perform acts of: receiving, by a first data processing device, a partition of N data values from the large time series of data; and solving, by the first data processing device, a first portion of a recursive filter equation to obtain K final filter values for the partition prior to obtaining all N filter values for the partition, where K<N.

(16) The configuration of (15), wherein the solving comprises solving a linear recurrence relation.

(17) The configuration of (15) or (16), wherein the solving comprises solving K first final partial solutions and combining the K first final partial solutions with K second final partial solutions to obtain the K final filter values.

(18) The configuration of (17), further comprising computing, at the first data processing device, the K second final partial solutions in parallel with additional second final partial solutions computed at a second data processing device.

(19) The configuration of (17) or (18), further comprising computing, at the first data processing device, the K final filter values in parallel with additional final filter values computed at a second data processing device.

(20) The configuration of any one of (15) through (19), wherein the recursive filter equation is of the form $$y_n = \sum_{m=0}^{M} b_m x_{n-m} - \sum_{k=1}^{K} a_k y_{n-k}$$

where the $y_n$ represents the filter values, the $x_n$ represents received data values, $a_k$ represents first coefficients, $b_m$ represents second coefficients, and M and K are integers.

(21) The configuration of (20), wherein the first portion of the recursive filter equation comprises a recursive summation of filter values.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

The section headings used herein are for organizational purposes only and are not to be construed as limiting the subject matter described in any way.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

The invention claimed is:

1. A method of filtering a signal for operation of a system that is arranged to receive the signal, the method comprising:
receiving, by a first data processing device of a filter, a partition of N data values comprising a time series of data that is representative of a first portion of the signal;
solving, by the first data processing device, a first portion of a recursive filter equation for filtering the signal to obtain K final filter values for the partition prior to obtaining all N filter values for the partition, where K<N; and
providing the final filter values for operation of the system.

2. The method of claim 1, wherein the solving comprises solving a linear recurrence relation.

3. The method of claim 1, wherein the solving comprises solving K first final partial solutions and combining the K first final partial solutions with K second final partial solutions to obtain the K final filter values.

4. The method of claim 3, further comprising computing, by the first data processing device, the K second final partial solutions in parallel with additional second final partial solutions computed at a second data processing device for a second portion of the signal.

5. The method of claim 3, further comprising providing, by the first data processing device, the K final filter values to a second data processing device, wherein the K final filter values are used as initial conditions for a second partition of data values comprising a time series of data that is representative of a second portion of the signal.

6. The method of claim 1, wherein the recursive filter equation is of the form $$y_n = \sum_{m=0}^{M} b_m x_{n-m} - \sum_{k=1}^{K} a_k y_{n-k}$$

where the $y_n$ represents the filter values, the $x_n$ represents received data values, $a_k$ represents first coefficients, $b_m$ represents second coefficients, and M and K are integers.

7. The method of claim 6, wherein the first portion of the recursive filter equation comprises a recursive summation of filter values.

8. A filter adapted to filter a large time series of data, the filter comprising:
a first data processing device in communication with memory, wherein the first data processing device is configured to receive a partition of N data values from the time series of data, solve a linear recurrence relation for a first portion of a recursive filter equation to obtain K final filter values for the partition prior to obtaining all N filter values for the partition, where K<N, and to output the N filter values for the partition.

9. The filter of claim 8, wherein the first data processing device comprises a field-programmable gate array or digital signal processor.

10. The filter of claim 8, wherein the first data processing device is adapted to compute K first final partial solutions and combine the K first final partial solutions with K second final partial solutions to obtain the K final filter values.

11. The filter of claim 10, wherein the first data processing device is adapted to compute the K second final partial solutions in parallel with additional second final partial solutions computed at a second data processing device.

12. The filter of claim 10, wherein the first data processing device is adapted to compute the K final filter values in parallel with additional final filter values computed at a second data processing device.

13. The filter of claim 8, wherein the recursive filter equation is of the form $$y_n = \sum_{m=0}^{M} b_m x_{n-m} - \sum_{k=1}^{K} a_k y_{n-k}$$

where the $y_n$ represents the filter values, the $x_n$ represents received data values, $a_k$ represents first coefficients, $b_m$ represents second coefficients, and M and K are integers.

14. The filter of claim 13, wherein the first portion of the recursive filter equation comprises a recursive summation of filter values.

15. Computer-readable medium comprising instructions for filtering large time series of data that, when executed by at least one data processing device, adapt the at least one data processing device to perform acts of:

receiving, by a first data processing device, a partition of N data values from the large time series of data; and solving, by the first data processing device, a first portion of a recursive filter equation to obtain K final filter values for the partition prior to obtaining all N filter values for the partition, where K<N.

16. The computer-readable medium of claim 15, wherein the solving comprises solving a linear recurrence relation.

17. The computer-readable medium of claim 15, wherein the solving comprises solving K first final partial solutions and combining the K first final partial solutions with K second final partial solutions to obtain the K final filter values.

18. The computer-readable medium of claim 17, further comprising computing, at the first data processing device, the K second final partial solutions in parallel with additional second final partial solutions computed at a second data processing device.

19. The computer-readable medium of claim 17, further comprising computing, at the first data processing device, the K final filter values in parallel with additional final filter values computed at a second data processing device.

20. The computer-readable medium of claim 15, wherein the recursive filter equation is of the form $$y_n = \sum_{m=0}^{M} b_m x_{n-m} - \sum_{k=1}^{K} a_k y_{n-k}$$

where the $y_n$ represents the filter values, the $x_n$ represents received data values, $a_k$ represents first coefficients, $b_m$ represents second coefficients, and M and K are integers.

21. The computer-readable medium of claim 20, wherein the first portion of the recursive filter equation comprises a recursive summation of filter values.

\* \* \* \* \*